US010986749B2

(12) United States Patent
Dickow et al.

(10) Patent No.: US 10,986,749 B2
(45) Date of Patent: Apr. 20, 2021

(54) SWITCH CABINET FOR EXHAUST-GAS MEASUREMENT INSTALLATIONS

(71) Applicant: AVL EMISSION TEST SYSTEMS GMBH, Neuss (DE)

(72) Inventors: Achim Dickow, Velbert (DE); Norbert Kreft, Meerbusch (DE)

(73) Assignee: AVL EMISSION TEST SYSTEMS GMBH, Neuss (DE)

( * ) Notice: Subject to any disclaimer, the term of this patent is extended or adjusted under 35 U.S.C. 154(b) by 207 days.

(21) Appl. No.: 16/305,060

(22) PCT Filed: Apr. 13, 2017

(86) PCT No.: PCT/EP2017/058932
§ 371 (c)(1),
(2) Date: Nov. 28, 2018

(87) PCT Pub. No.: WO2017/207160
PCT Pub. Date: Dec. 7, 2017

(65) Prior Publication Data
US 2020/0323099 A1 Oct. 8, 2020

(30) Foreign Application Priority Data

May 31, 2016 (DE) ...................... 10 2016 110 066.8

(51) Int. Cl.
*G01M 15/10* (2006.01)
*H05K 7/18* (2006.01)
(Continued)

(52) U.S. Cl.
CPC .............. *H05K 7/18* (2013.01); *G01M 15/02* (2013.01); *G01M 15/102* (2013.01);
(Continued)

(58) Field of Classification Search
CPC .... G01M 15/02; G01M 15/10; G01M 15/102; G01N 1/2247
(Continued)

(56) References Cited

U.S. PATENT DOCUMENTS

| 5,613,713 A | 3/1997 | Gysi et al. |
| 5,729,452 A | 3/1998 | Smith et al. |

(Continued)

FOREIGN PATENT DOCUMENTS

| CN | 105435616 A | 3/2016 |
| DE | 10 2014 116 062 A1 | 5/2015 |

(Continued)

OTHER PUBLICATIONS

CEMS Experts: "Gasmet CEMS", pp. 1-2 (2014), Retrieved from the Internet on Jun. 12, 2017: URL:http://cems-experts.com/old_Gasmet_CEMS.html.

(Continued)

*Primary Examiner* — Eric S. McCall
(74) *Attorney, Agent, or Firm* — Norman B. Thot

(57) ABSTRACT

A switch cabinet for an exhaust-gas measurement installation includes a cabinet body with two side walls, a ceiling, a floor, a front side and a back wall, a door to close the front side, a measurement gas distributor arranged in the cabinet body with an outlet, a coupling element fastened to the measurement gas distributor to form the outlet, at least one measuring device arranged in the cabinet body with an inlet, and a coupling element fastened to the at least one measuring device to form the inlet. The inlet is connected to the outlet to provide a gas-tight connection. The measurement gas distributor moves relative to the cabinet body so that the coupling element fastened to the measurement gas distribu- (Continued)

tor and forming the outlet can be connected by insertion to the coupling element fastened to the at least one measuring device and forming the inlet.

15 Claims, 3 Drawing Sheets

(51) Int. Cl.
  G01M 15/02 (2006.01)
  G01N 1/22 (2006.01)
  G01N 21/3504 (2014.01)
  G01N 21/76 (2006.01)
(52) U.S. Cl.
  CPC ....... *G01N 1/2252* (2013.01); *G01N 21/3504* (2013.01); *G01N 21/766* (2013.01)
(58) Field of Classification Search
  USPC .................. 73/23.31, 31.05, 114.71, 114.73
  See application file for complete search history.

(56) References Cited

U.S. PATENT DOCUMENTS

| 6,155,611 | A | * | 12/2000 | Lemire | F16L 37/08 |
| | | | | | 285/312 |
| D814,454 | S | * | 4/2018 | Dickow | D14/308 |
| 2002/0004694 | A1 | | 1/2002 | Mcleod et al. | |
| 2009/0126385 | A1 | * | 5/2009 | Trepte | H05K 7/20818 |
| | | | | | 62/259.2 |
| 2010/0132339 | A1 | | 6/2010 | Barkhage | |
| 2012/0291632 | A1 | | 11/2012 | Nishijima | |
| 2013/0068981 | A1 | | 3/2013 | Hotta et al. | |
| 2015/0153254 | A1 | | 6/2015 | Silvis et al. | |
| 2017/0010207 | A1 | | 1/2017 | Fetzner et al. | |
| 2018/0231496 | A1 | * | 8/2018 | Brennan | G01N 27/4163 |
| 2019/0031432 | A1 | * | 1/2019 | Dickow | B65D 88/744 |
| 2019/0242786 | A1 | * | 8/2019 | Dickow | F01N 11/005 |
| 2019/0319449 | A1 | * | 10/2019 | Gegenbauer | H02H 1/0023 |
| 2019/0379183 | A1 | * | 12/2019 | Winsor | H05K 9/009 |
| 2020/0122187 | A1 | * | 4/2020 | DiStefano | B60R 15/02 |

FOREIGN PATENT DOCUMENTS

| EP | 1 484 592 A1 | 12/2004 |
| EP | 2 317 833 A1 | 5/2011 |
| JP | 08-233738 A | 9/1996 |
| JP | 2008-309581 A | 12/2008 |

OTHER PUBLICATIONS

Mercury Instruments Analytical Technologies: "MMS Automatic Monitoring of Mercury in Air and other Gases", pp. 1-4 (2008), Retrieved from the Internet on Jun. 9, 2017: URL:http://www.mercury-instruments.com/pdf_downloads/Mercury-Instruments-MMS-en.pdf.

Rosemount Analytical: "GMP 1000M Continuous Emissions Monitoring System (CEMS) with MLT Analyzer", Product Data Sheet, pp. 1-8 (Jul. 2013), Retrieved from the Internet on Jun. 12, 2017: URL:http://www.emerson.com/documents/automation/69450.pdf.

* cited by examiner

SWITCH CABINET FOR EXHAUST-GAS MEASUREMENT INSTALLATIONS

CROSS REFERENCE TO PRIOR APPLICATIONS

This application is a U.S. National Phase application under 35 U.S.C. § 371 of International Application No. PCT/EP2017/058932, filed on Apr. 13, 2017 and which claims benefit to German Patent Application No. 10 2016 110 066.8, filed on May 31, 2016. The International Application was published in German on Dec. 7, 2017 as WO 2017/207160 A1 under PCT Article 21(2).

FIELD

The present invention relates to a switch cabinet for exhaust-gas measurement installations, comprising a cabinet body which is composed of two side walls, a ceiling, a floor, and a back wall, and which can be closed by a door arranged on the front side, wherein a measurement gas distributor and at least one measuring device are arranged in the cabinet body, and an outlet of the measurement gas distributor is connected in a gas-tight manner to an inlet of the at least one measuring device.

BACKGROUND

Such switch cabinets are in particular used in the automotive industry to determine the emission behavior of motor vehicles. The motor vehicle thereby performs a defined driving cycle on a roller-type test stand, wherein the emitted exhaust gases are collected, if necessary diluted, and fed into a switch cabinet configured as an analysis unit. In the switch cabinet are arranged a power supply unit, a control unit, the electronic system, cooling units, and a calibrating unit besides various measuring devices to determine various components of the exhaust gas, such as, for example, hydrocarbons, methane or nitrogen oxides. The switch cabinet further comprises a plurality of connections, lines and gas distributors via which the gases are guided to the respective units and distributed.

A switch cabinet for an exhaust gas measuring installation which is composed of two cabinet parts is described, for example, in EP 2 317 833 A1. Measuring devices and a computer are arranged in the front cabinet part, and an inlet interface for introducing measuring gases, measuring gas pumps, valves and pressure reducers are arranged in the rear cabinet part.

The configuration described in EP 2 317 833 A1 and such switch cabinets generally are problematic in that the measurement gas must be conducted, starting from the gas inlet, into the cabinet body and to the measuring devices via hoses or metal conduits, and that the temperature of the measurement gas permanently changes. In order to provide that the gas in the measuring device has the temperature required for measuring, the measurement gas inlets of the measuring devices each comprise a heater unit and a temperature monitoring unit, thus increasing costs of and the installation space for the measuring devices. In switch cabinets having such a design, the maintenance of the measuring devices is also difficult because, before maintenance work can be performed on the measuring devices, these must be removed from the cabinet and the hoses and cables connected thereto removed.

SUMMARY

An aspect of the present invention is to provide an improved switch cabinet for exhaust-gas measurement installations so that the gas conduit to the measuring devices within the switch cabinet is designed to allow the measuring devices to be realized with smaller sizes and at reduced costs and where the maintenance of the measuring devices is facilitated.

In an embodiment, the present invention provides a switch cabinet for an exhaust-gas measurement installation which includes a cabinet body comprising two side walls, a ceiling, a floor, a front side and a back wall, a door arranged on the cabinet body to close the front side, a measurement gas distributor arranged in the cabinet body, the measurement gas distributor comprising an outlet, at least one coupling element fastened to the measurement gas distributor so as to form the outlet, at least one measuring device arranged in the cabinet body, the at least one measuring device comprising an inlet, and a coupling element fastened to the at least one measuring device so as to form the inlet. The inlet of the at least one measuring device is connected to the outlet of the measurement gas distributor to provide a gas-tight connection. The measurement gas distributor is configured for a movement relative to the cabinet body so that, for the gas-tight connection of the measurement gas distributor to the at least one measuring device, the at least one coupling element fastened to the measurement gas distributor and forming the outlet can be connected by insertion to the coupling element fastened to the at least one measuring device and forming the inlet.

BRIEF DESCRIPTION OF THE DRAWINGS

The present invention is described in greater detail below on the basis of embodiments and of the drawings in which.

DETAILED DESCRIPTION

Figure 1:
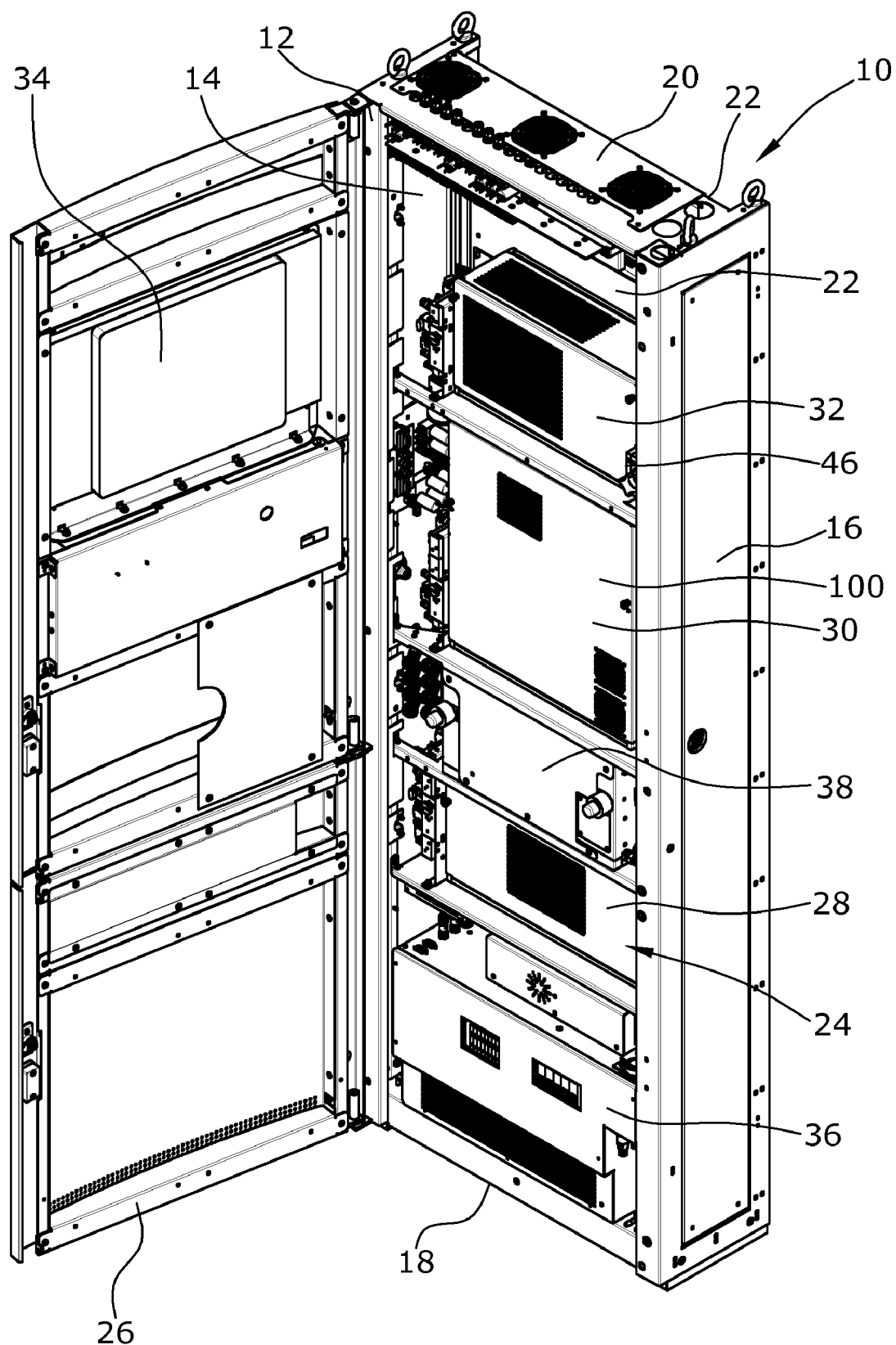
FIG. 1 is a frontal view of a switch cabinet for an exhaust-gas measurement installation.

Since the measurement gas distributor is arranged for movement relative to the cabinet body so that, for the gas-tight connection of the measurement gas distributor to the at least one measuring device, at least one coupling element, fastened to the measurement gas distributor and forming an outlet, can be connected by insertion to a coupling element fastened to the at least one measuring device and forming an inlet, it is possible to omit the gas conduit that is normally realized by hoses or metal pipes so that, between the measurement gas distributor and the measurement gas inlet of the measuring device, the temperature will not change and the heater unit and the temperature monitoring unit that are integrated into the measurement gas distributor can be used for all measuring devices connected to the measurement gas distributor. The heater units arranged at the measurement gas inlets of the measuring devices and the temperature monitoring unit can thereby be omitted so that the measuring device can be realized with a reduced size and at lesser expense. It is also not necessary to remove the gas conduits from the measuring device for maintenance work performed on the measuring device, thus facilitating maintenance of the measuring devices.

In an embodiment of the present invention, the measurement gas distributor can, for example, be arranged in the cabinet body for translational or rotary movement, whereby the coupling element of the measurement gas distributor and the coupling element of the measuring device can be moved, by being guided via a translational displacement or a rotary movement, into the correct position, and in this position can be simply connected to or separated from each other.

In an embodiment of the present invention, the measurement gas distributor can, for example, be arranged to be horizontally displaced in the cabinet body via a guide, wherein the guide comprises a first rail fastened to the cabinet body and a second rail fastened to the measurement gas distributor and sliding in the first rail. A simple and inexpensive device for a displaceable arrangement of the measurement gas distributor is provided via the rail guide.

In an embodiment of the present invention, the first rail can, for example, be at least one metal sheet fastened to the rear wall and comprising projecting portions at both ends, and the second rail can, for example, be designed in the manner of a bracket, wherein the two ends of the bracket-like second rail engage behind the projecting portions of the first rail. A rail guide is thereby provided in a particularly simple and inexpensive manner.

In an embodiment of the present invention, the at least one measuring device can, for example, be supported in the cabinet body via an extension and retraction device. At least one element of the at least one measuring device is alternatively supported in the cabinet body via an extension and retraction device. The measuring devices are normally placed on storage trays which are fixedly arranged in the cabinet body in horizontal orientation. For maintenance and diagnosis of the measuring devices, it is first required to pull these out of the storage trays and to remove all connections so that maintenance and diagnosis of the measuring devices can be carried out only when the switch cabinet is not in operation. Arranging the measuring device via an extension and retraction device makes it possible to pull the measuring device out from the cabinet body at least partially, which will suffice for performing maintenance and diagnosis of the measuring devices. Maintenance and diagnosis of the measuring devices are thereby facilitated, wherein, since no hoses or cables need to be detached, maintenance and diagnosis can be carried out while the switch cabinet is in operation.

In an embodiment of the present invention, the extension and retraction device can, for example, comprise a carrier element fixedly arranged in the cabinet body, and a pivoting unit pivotally arranged on the cabinet body, wherein the at least one measuring device or an element of the at least one measuring device is fastened to the pivoting unit. In an embodiment of the present invention, the pivoting unit can, by a first end, be pivotally fastened to the carrier element and comprise an abutment face which in its maximally extended position is in abutment on a stop surface. A simple, installation-space-saving and inexpensive embodiment of the extension and retraction device is provided thereby.

In an embodiment of the present invention, the extension and retraction device can, for example, comprise a hydraulic damper element so that the measuring device can be held in different intermediate positions.

In an embodiment of the present invention, the coupling element of the measurement gas distributor can, for example, comprise an outer thread, and the coupling element of the at least one measuring device can, for example, comprise a biased cap nut so that the connection of the two coupling elements is simplified and can be established in a restricted and difficulty accessible space.

In an embodiment of the present invention, the measurement gas distributor can, for example, comprise a first and a second coupling element, wherein the second coupling element serves as a second outlet and can be connected in a gas-tight manner to a coupling element of a second measuring device. A measurement gas distributor can in this manner be used for two measuring devices, thereby avoiding the costs and the installation space for a second measurement gas distributor.

The at least one measuring device can, for example, be a chemiluminescence detector analysis device or an infrared-detector analysis device.

In an embodiment of the present invention, the measurement gas distributor can, for example, be arranged in the cabinet body for horizontal displacement via a first guide and for vertical displacement via a second guide. The measurement gas distributor can thereby be arranged in the cabinet body in a flexible manner so that, in accordance with a measurement to be performed, a measurement gas distributor can be correspondingly shifted and be connected to the measuring devices required for measurement.

In an embodiment of the present invention, the measurement gas distributor can, for example, comprise a coupling element which by the vertical and horizontal displacement of the measurement gas distributor is connectible to the coupling element of a first or a second measuring device. The measurement gas distributor can thus be shifted between two positions and, in accordance with the measurement, be coupled to the respective measuring device.

In an embodiment of the present invention, the measurement gas distributor can, for example, comprise two coupling elements which via the translational displacement of the measurement gas distributor are connectible to the respective coupling elements of a first and a second measuring device. The measurement gas distributor can thereby be coupled to, or decoupled from, two measuring devices simultaneously.

There is thus provided a switch cabinet for exhaust-gas measurement installations wherein the measuring devices arranged therein can be designed in a more installation-space-saving and less expensive manner since the heater unit and the temperature control unit at the measuring gas inlets of the individual measuring devices can be omitted. Maintenance is further facilitated because the gas conduits need not be removed from the measuring devices.

An exemplary embodiment of a switch cabinet for an exhaust-gas measurement installation according to the present invention is illustrated in the drawings and will be described hereunder.

The switch cabinet 10 for an exhaust-gas measurement installation is composed of a cabinet body 12 having a first side wall 14, an opposite second side wall 16, a floor 18, a ceiling 20, and a rear wall 22. An open front side 24 of the cabinet body 12 can be closed by a door 26 which is pivotably fastened to the first side wall 14.

Internally of the switch cabinet 10, measuring devices 28, 30, 32 are arranged for analysis of measuring gases, which measuring devices 28, 30, 32 are controllable by an operating unit 34 arranged in the door 26. A power supply unit 36 is arranged on the floor 18 of the cabinet body 12 via which the measuring devices 28, 30, 32 and other components arranged in the cabinet body 12 are supplied with power. The first measuring device 28, which is an infrared-detector analyzing device, is arranged above the power supply unit 36 and is used, for example, to detect carbon monoxide, carbon dioxide or hydrocarbon compounds. The measuring gas in the infrared detector analyzing device 28 is cooled via a cooler 38 arranged above the infrared detector analyzing device 28 and freed from condensate.

The second measuring device 30 is arranged above the cooler 38. The second measuring device is configured as a chemiluminescence analyzing device via which the amount of nitrogen oxide in the exhaust gas is measured.

A flame ionization analyzing device for detecting hydrocarbons is arranged as a third measuring device 32 above the chemiluminescence analyzing device 30.

A measurement gas distributor 46 is arranged on the second side wall 16 and is operative to distribute the measuring gas among the corresponding measuring devices 28, 30, 32.

Figure 2:
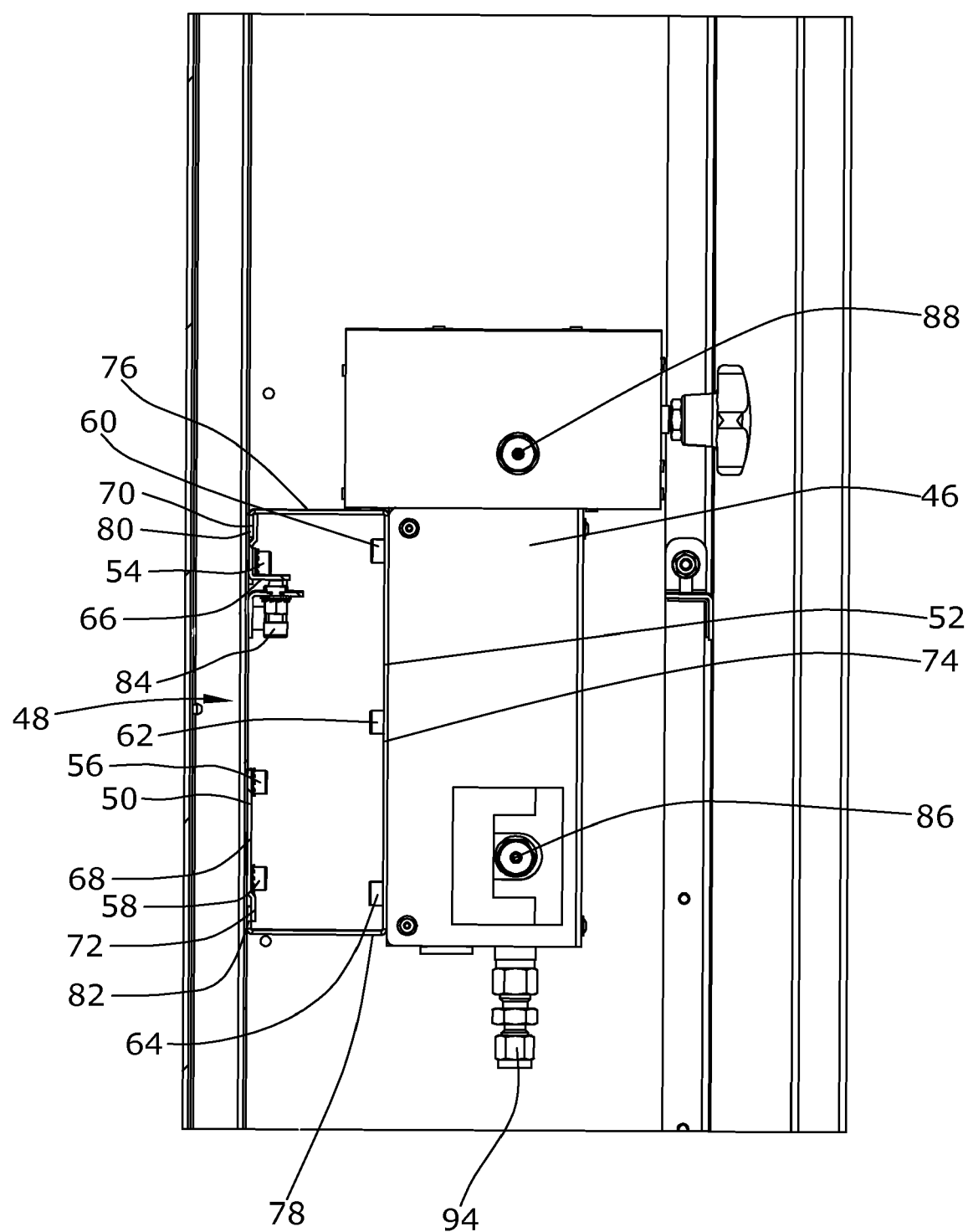
FIG. 2 is a lateral view of a measurement gas distributor of FIG. 1 with a configuration of the measurement gas distributor as provided by the present invention.

FIG. 2 shows a displaceable arrangement of the measurement gas distributor 46 on the second side wall 16 of the cabinet body 12 as provided by the present invention.

The measurement gas distributor 46 is arranged to allow for a horizontal displacement via a guide 48 on the rear wall 22 of the cabinet body 12. The guide 48 comprises a first rail 50 which is fastened by screws 54, 56, 58 to the rear wall 22 of the cabinet body 12, and a second rail 52 which is fastened by screws 60, 62, 64 to the measurement gas distributor 46.

The first rail 50 is composed of two shaped metal sheets 66, 68 arranged in abutment on the rear wall 22, which two shaped metal sheets 66, 68 on their mutually averted vertical ends comprise a respective projecting portion 70, 72 and thereby form a respective gap between the rear wall 22 and the respective projecting portion 70, 72.

The second rail 52 is designed in the manner of a bracket and comprises a wall 74 arranged in abutment on the measurement gas distributor 46, horizontally extending walls 76, 78 adjoining both vertical ends of the wall 74, and collars 80, 82 adjoining the horizontally extending walls 76, 78 and extending parallel to the wall 74.

The collars 80, 82 engage behind the projecting portions 70, 72 in the mounted state so that the second rail is arranged on the first rail in a vertically fixed and horizontally movable manner. The metal sheet 66 is engaged by a setting screw 84 which is screwed into a first coupling element 86 fastened to cabinet body 12. By screwing the setting screw 84 in and out, the metal sheet 66 will be adjusted in vertical direction and thereby the guide 48 will be set for best possible functioning.

Figure 3:
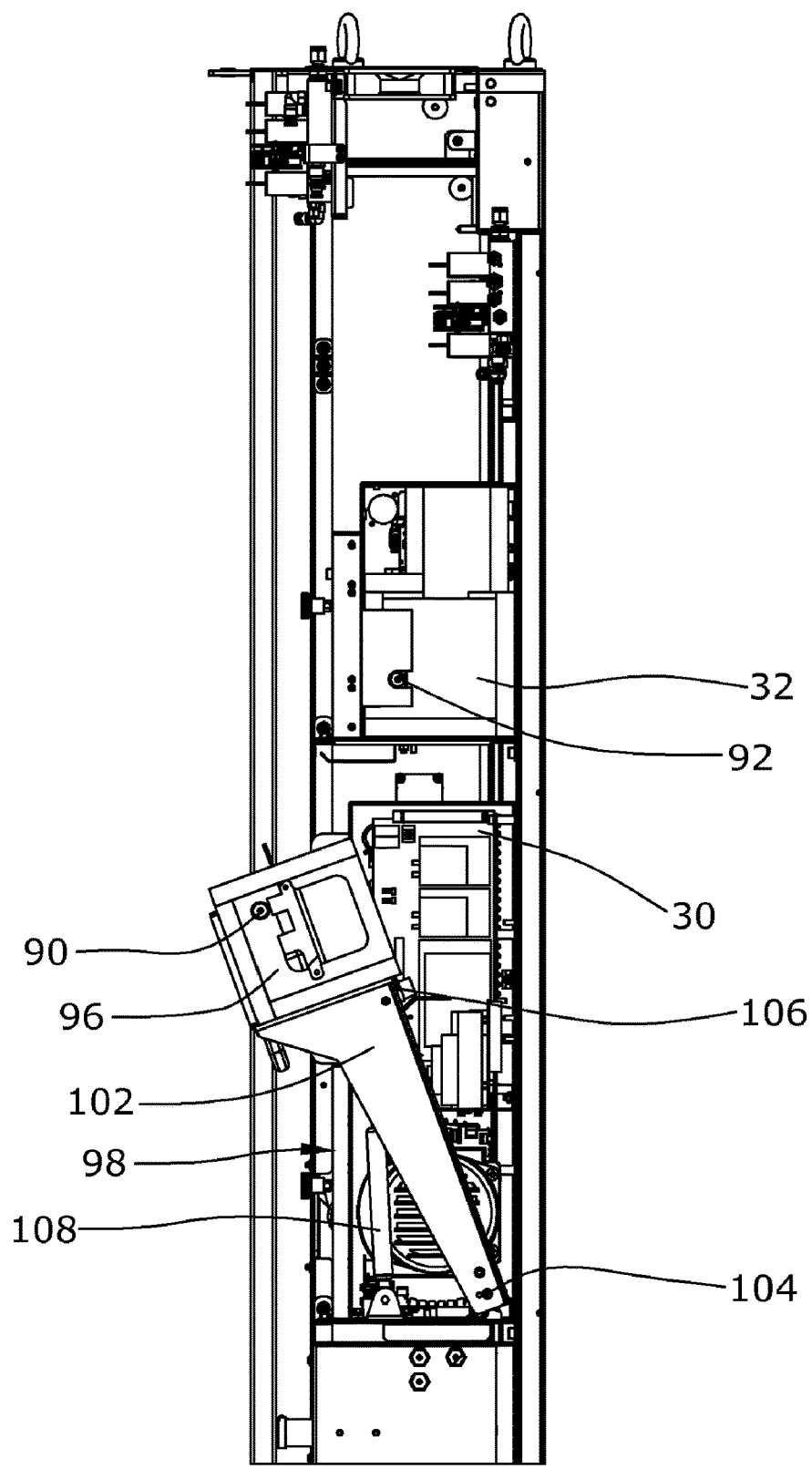
FIG. 3 is a lateral view of the switch cabinet of FIG. 1.

The measurement gas distributor 46 comprises, on the side facing toward the measuring devices 28, 30, 32, a first coupling element 86 and a second coupling element 88 that form two outlets of the measurement gas distributor 46 and are adapted for gas-tight connection to coupling elements 90, 92 of the second measuring device 30 and the third measuring device 32 (see FIG. 3). A further coupling element 94 of the measurement gas distributor 46 is connected, via a hose (not shown in the drawings) to the first measuring device 28 so that all measuring devices 28, 30, 32 arranged in the cabinet body 12 are fed with power via the measurement gas distributor 46.

The connection of the coupling elements 86, 88 of the measurement gas distributor 46 to the coupling elements 90, 92 of the second measuring device 30 and the third measuring device 32 is effected by a horizontal displacement of the measurement gas distributor 46, wherein the measurement gas distributor 46 will be displaced until the coupling elements 86, 88 of the measurement gas distributor 46 have become inserted into the coupling elements 90, 92 of the measuring devices 30, 32. The final fixation is established by outer threads formed on the coupling elements 86, 88 of the measurement gas distributor 46 and biased cap nuts arranged on each coupling element 90, 92 of the second measuring device 30 and the third measuring device 32.

FIG. 3 shows a pivotable arrangement of an element 96 of the second measuring device 30 where the element 96 is a cooling unit of a chemiluminescence-detector analysis device. Other embodiments of the switch cabinet 10 can also include complete measuring devices 28, 30, 32 pivotally arranged in the cabinet body 12.

The cooling unit 96 is pivotally arranged in the cabinet body 12 via an extension and retraction device 98. The extension and retraction device 98 comprises a carrier element 100 fixedly arranged in the cabinet body 12, which in the shown embodiment forms the housing of the second measuring device 30, and a pivoting unit 102 pivotally supported therein, wherein the cooling unit 96 is fastened to the pivoting unit 102. The pivoting unit 102 is pivotally supported in the carrier element 100 by a bolt 104 and comprises an abutment face 106 which will be in abutment on a stop face, formed on the carrier element 100 (not shown in the drawings), when the pivoting unit 102 has been pivoted fully outward.

The pivoting unit 102 further comprises a hydraulic damper 108 which is fastened by one end to the carrier element 100 and which is fastened by the other end to the pivoting unit 102. The hydraulic damper 108 can herein be designed for use exclusively for damping the extension movement of the pivoting unit 102 or to realize different extension movements of the pivoting unit 102.

Maintenance and diagnosis of the cooling unit 96 is facilitated via such a pivotable arrangement of the cooling unit 96 or in other embodiments of entire measuring devices. It is not required for this purpose to remove the cooling unit 96 entirely from the switch cabinet and to detach the conduits and cables connected thereto.

A switch cabinet for exhaust-gas measurement installations is thus provided wherein the conducting of the measuring gas is facilitated since the heating and the temperature monitoring at the measuring gas inlets of the measuring devices are omitted and, consequently, the measuring devices can be designed in a more installation-space-saving and less expensive manner. Maintenance of the measuring devices is also facilitated because no gas conduits need be removed from the measuring unit.

It is to be understood that the scope of protection of the present main claim is not limited to the described exemplary embodiment. It can in particular be envisioned that the measurement gas distributor is displaceable, in addition to the horizontal displacement, also in vertical direction by providing an additional guide for vertical displacement. The measuring cabinet can also be equipped with other or additional measuring devices, or measuring devices other than the chemiluminescence-detector analysis device, or its element can be pivotally arranged in the cabinet body 12. Reference should also be had to the appended claims.

What is claimed is:

1. A switch cabinet for an exhaust-gas measurement installation, the switch cabinet comprising:
    a cabinet body comprising two side walls, a ceiling, a floor, a front side, and a back wall;
    a door arranged on the cabinet body to close the front side;
    a measurement gas distributor arranged in the cabinet body, the measurement gas distributor comprising an outlet;
    at least one coupling element fastened to the measurement gas distributor so as to form the outlet;
    at least one measuring device arranged in the cabinet body, the at least one measuring device comprising an inlet; and a coupling element fastened to the at least one measuring device so as to form the inlet;

wherein, the inlet of the at least one measuring device is connected to the outlet of the measurement gas distributor to provide a gas-tight connection, and the measurement gas distributor is configured for a movement relative to the cabinet body so that, for the gas-tight connection of the measurement gas distributor to the at least one measuring device, the at least one coupling element fastened to the measurement gas distributor and forming the outlet is connected by insertion with the coupling element fastened to the at least one measuring device and forming the inlet via the movement of the measurement gas distributor relative to the cabinet body.

2. The switch cabinet as recited in claim 1, wherein the movement of the measurement gas distributor in the cabinet body is a translational movement or a rotary movement.

3. The switch cabinet as recited in claim 1, wherein, the at least one coupling element fastened to the measurement gas distributor comprises an outer thread, and the coupling element fastened to the at least one measuring device comprises a biased cap nut.

4. The switch cabinet as recited in claim 1, wherein, a first coupling element and a second coupling element are provided as the at least one coupling element fastened to the measurement gas distributor, a first measuring device and a second measuring device are provided as the at least one measuring device, the first coupling element serves as a first outlet and is connectable to provide the gas-tight connection to a coupling element of the first measuring device, and the second coupling element serves as a second outlet and is connectable to provide the gas-tight connection to a coupling element of the second measuring device.

5. The switch cabinet as recited in claim 1, wherein the at least one measuring device is a chemiluminescence-detector analysis device or an infrared-detector analysis device.

6. The switch cabinet as recited in claim 1, further comprising:

a guide comprising a first rail which is fastened to the cabinet body and a second rail which is fastened to the measurement gas distributor, the second rail being configured to slide in the first rail, wherein, the movement of the measurement gas distributor in the cabinet body is a horizontal displacement via the guide.

7. The switch cabinet as recited in claim 6, wherein, the first rail is at least one metal sheet which is fastened to the rear wall, the at least one metal sheet comprising projecting portions at each vertical end thereof, and the second rail is designed bracket-like comprising two ends, the two ends being configured to engage behind the projecting portions of the first rail.

8. The switch cabinet as recited in claim 1, further comprising:

an extension and retraction device, wherein, the at least one measuring device is supported in the cabinet body via the extension and retraction device.

9. The switch cabinet as recited in claim 8, wherein the at least one measuring device further comprises at least one element which is supported in the cabinet body via the extension and retraction device.

10. The switch cabinet as recited in claim 9, wherein, the extension and retraction device comprises a carrier element which is fixedly arranged in the cabinet body and a pivoting unit which is configured to pivot in the cabinet body, and the at least one measuring device or the at least one element of the at least one measuring device is fastened to the pivoting unit.

11. The switch cabinet as recited in claim 10, wherein the pivoting unit comprises a first end which is pivotally fastened to the carrier element and an abutment face which, in a maximally extended position, abuts on a stop surface of the carrier element.

12. The switch cabinet as recited in claim 10, wherein the extension and retraction device further comprises a hydraulic damper element.

13. The switch cabinet as recited in claim 1, further comprising:

a first guide; and a second guide, wherein, the measurement gas distributor is arranged in the cabinet body for a horizontal displacement via the first guide and for a vertical displacement via the second guide.

14. The switch cabinet as recited in claim 13, wherein, a first measuring device and a second measuring device are provided as the at least one measuring device, the first measuring device comprising a first coupling element as the coupling element and the second measuring device comprising a second coupling element as the coupling element the measurement gas distributor comprises a coupling element which, via the horizontal displacement and the vertical displacement of the measurement gas distributor, is connectible to the first coupling element of the first measuring device or to the second coupling element of the second measuring device.

15. The switch cabinet as recited in claim 13, wherein, the measurement gas distributor comprises a first coupling element and a second coupling element as the at least one coupling element, a first measuring device and a second measuring device are provided as the at least one measuring device, the first measuring device comprising a first coupling as the coupling element and the second measuring device comprising a second coupling as the coupling element, and the first coupling element and the second coupling element of the measurement gas distributor are, via a translational displacement of the measurement gas distributor, connectible to the respective first coupling and second coupling.

* * * * *